US012760172B2

(12) United States Patent
Kim et al.

(10) Patent No.: US 12,760,172 B2
(45) Date of Patent: Oct. 13, 2026

(54) FLAME-RETARDANT PLASTIC MATERIAL AND MANUFACTURING METHOD THEREOF

(71) Applicant: SAMSUNG ELECTRONICS CO., LTD., Suwon-si (KR)

(72) Inventors: Miran Kim, Suwon-si (KR); Nohcheol Park, Suwon-si (KR); Youngdeog Koh, Suwon-si (KR); Kwangjoo Kim, Suwon-si (KR); Jongun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 759 days.

(21) Appl. No.: 18/093,848

(22) Filed: Jan. 6, 2023

(65) Prior Publication Data

US 2023/0203290 A1 Jun. 29, 2023

Related U.S. Application Data

(63) Continuation of application No. PCT/KR2022/021383, filed on Dec. 27, 2022.

(30) Foreign Application Priority Data

Dec. 27, 2021 (KR) ........................ 10-2021-0189003
Mar. 11, 2022 (KR) ........................ 10-2022-0030972

(51) Int. Cl.
*C08L 23/12* (2006.01)
*C08K 3/22* (2006.01)
*C08K 3/34* (2006.01)
*H05K 1/02* (2006.01)

(52) U.S. Cl.
CPC ................ *C08L 23/12* (2013.01); *C08K 3/22* (2013.01); *C08K 3/34* (2013.01); *H05K 1/02* (2013.01); *C08K 2003/2224* (2013.01); *C08L 2201/02* (2013.01)

(58) Field of Classification Search
CPC ..... C08L 23/12; C08L 23/14–17; C08K 3/22; C08K 2003/2224
See application file for complete search history.

(56) References Cited

U.S. PATENT DOCUMENTS

| | | | | |
|---|---|---|---|---|
| 6,565,348 | B1 * | 5/2003 | Snijder | B29C 48/402 366/83 |
| 9,284,414 | B2 | 3/2016 | Boday et al. | |
| 10,851,238 | B2 | 12/2020 | Pang et al. | |
| 11,008,440 | B2 | 5/2021 | Wen et al. | |
| 11,248,115 | B2 | 2/2022 | Aarnio-Winterhof et al. | |
| 2004/0010070 | A1 * | 1/2004 | Sato | C08L 53/00 524/505 |
| 2005/0285086 | A1 | 12/2005 | Kosaka et al. | |
| 2018/0048055 | A1 * | 2/2018 | O'Driscoll | H01Q 7/00 |
| 2018/0265683 | A1 * | 9/2018 | Shimizu | C08K 5/5205 |
| 2021/0130610 | A1 | 5/2021 | Hsieh | |
| 2021/0171833 | A1 | 6/2021 | Ni et al. | |

FOREIGN PATENT DOCUMENTS

| | | | | |
|---|---|---|---|---|
| CN | 101619152 | A | 1/2010 | |
| CN | 102888025 | A | 1/2013 | |
| CN | 101805480 | B | 3/2013 | |
| CN | 104672461 | A | 6/2015 | |
| CN | 109563301 | A | 4/2019 | |
| CN | 109844003 | A | 6/2019 | |
| CN | 108603006 | B | 2/2021 | |
| CN | 112759827 | A | 5/2021 | |
| EP | 3 497 156 | B1 | 4/2021 | |
| JP | 2007277530 | A * | 10/2007 | |
| JP | 2013006995 | A * | 1/2013 | C08L 23/0807 |
| KR | 10-2010-0025211 | A | 3/2010 | |
| KR | 10-2010-0025212 | | 3/2010 | |
| KR | 10-2010-0118965 | | 11/2010 | |
| KR | 10-2123637 | | 6/2020 | |
| KR | 10-2154445 | B1 | 9/2020 | |
| WO | WO 2005-049716 | A1 | 6/2005 | |
| WO | WO 2010/024602 | A2 | 3/2010 | |

OTHER PUBLICATIONS

Partial machine translation of JP 2013-006995 A (Year: 2013).*
Partial machine translation of JP 2007-277530 A (Year: 2007).*
International Search Report dated Apr. 14, 2023 in International Patent Application No. PCT/KR2022/021383.
PCT/ISA/237 dated Apr. 14, 2023 in International Patent Application No. PCT/KR2022/021383.
Lee et al.; "A Study on the Preparation of Halogen Free M-P Flame Retardant and Its Application to Composite Material", Journal of the Korean Society of Safety, 2009, vol. 24, No. 6, pp. 63 to 71.
Extended European Search Report issued Nov. 8, 2024 for European Patent Application No. 22916695.4.
Chinese Office Action issued Aug. 13, 2026 for Application No. 202280055525.8.

* cited by examiner

*Primary Examiner* — Kregg T Brooks
(74) *Attorney, Agent, or Firm* — STAAS & HALSEY LLP

(57) ABSTRACT

A flame-retardant plastic material composition including polypropylene resin, magnesium hydroxide, melamine-based resin, talc, rubber, and coupling agent, where the flame-retardant plastic material composition includes 30 to 45 parts by weight (wt %) of the magnesium hydroxide and 8 to 20 parts by weight (wt %) of the talc based on 100 parts by weight (wt %) of flame-retardant plastic material composition, and a tensile strength is from 130 to 600 kgf/$cm^2$.

14 Claims, 4 Drawing Sheets

FLAME-RETARDANT PLASTIC MATERIAL AND MANUFACTURING METHOD THEREOF

CROSS-REFERENCE TO RELATED APPLICATION

This application is a continuation application, under 35 U.S.C. § 111(a), of international application No. PCT/KR2022/021383, filed on Dec. 27, 2022, which claims priority under 35 U.S.C. § 119 to Korean Patent Application No. 10-2021-0189003, filed Dec. 27, 2021, and Korean Patent Application No. 10-2022-0030972, filed on Mar. 11, 2022, the disclosures of which are incorporated herein by reference in their entirety.

BACKGROUND

Field

The present disclosure relates to a flame-retardant plastic material composition and a manufacturing method thereof, and more particularly, to a flame-retardant plastic material having improved flame retardancy and mechanical properties by optimizing components of the plastic material composition and a manufacturing method thereof.

Discussion of Related Art

In recent years, demand for flame-retardant plastic materials has been increased to play a role in preventing the risk of fire that may occur from the inside of home appliances and upon ignition of a component, stopping spreading of flame. Particularly, flame-retardant plastic materials have been used in case PCBs, cabinet bottoms, and the like for home appliances.

Meanwhile, conventionally, materials applied to case PCBs for home appliances and refrigerator cabinet bottoms have been implemented, in order to prevent spreading of flames in the case of ignition, as an assembly of several components manufactured by bending steel plates or a single injection molded product of a flame-retardant plastic material. However, a method of bending steel plates and assembling the bent steel plates is complicated and additional assembling costs are required, and thus the trend has been toward using an injection-molded product of a flame-retardant plastic material as one piece.

In Patent Documents Chinese Patent No. 109844003 (Registration Date: May 11, 2021 and Chinese Patent No. 108603006 (Registration Date: Feb. 2, 2021), resins including phosphorus (P)-based flame retardants are applied to PCB cases of refrigerators. In Patent Document Chinese Patent No. 101805480 (Registration Date: Mar. 27, 2013), a resin including a bromine (Br)-based flame retardant is applied to a refrigerator. However, the P-based and Br-based flame retardants are expensive and dioxins and furans are generated during combustion, and thus these materials are under continuous environmental regulations.

SUMMARY

In accordance with an aspect of the present disclosure, a flame-retardant plastic material composition comprises polypropylene resin, magnesium hydroxide, melamine-based resin, talc, rubber, and coupling agent, wherein the flame-retardant plastic material composition includes 30 to 45 parts by weight (wt %) of the magnesium hydroxide and 8 to 20 parts by weight (wt %) of the talc based on 100 parts by weight (wt %) of flame-retardant plastic material composition, and wherein a tensile strength is from 130 to 600 kgf/cm$^2$.

In addition, the flame-retardant plastic material composition according to an embodiment of the present disclosure may include 24 to 35 parts by weight (wt %) of the polypropylene resin, 8 to 20 parts by weight (wt %) of the melamine-based resin, 5 to 15 parts by weight of the rubber, and 0.5 to 3 parts by weight (wt %) of the coupling agent based on 100 parts by weight (wt %) of the flame-retardant plastic material composition.

In addition, the flame-retardant plastic material composition according to an embodiment of the present disclosure may further include greater than 0 parts by weight (wt %) and equal to or less than 0.1 parts by weight (wt %) of an antioxidant based on 100 parts by weight (wt %) of the flame-retardant plastic material composition.

In addition, in the flame-retardant plastic material composition according to an embodiment of the present disclosure, the polypropylene resin may include at least one of a propylene homopolymer, an ethylene-propylene random copolymer, and an ethylene-propylene block copolymer, the magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane, and the melamine-based resin may include at least one of melamine cyanurate and melamine phosphate.

In addition, in the flame-retardant plastic material composition according to an embodiment of the present disclosure, the polypropylene resin may have a melt index (MI) of 50 to 100 g/10 min at 230° C. under a load of 2.16 kg.

In addition, in the flame-retardant plastic material composition according to an embodiment of the present disclosure, the magnesium hydroxide may have an average particle diameter of 0.5 to 5 μm, and the talc may have an average particle diameter of 1 to 20 μm.

In addition, in the flame-retardant plastic material composition according to an embodiment of the present disclosure, the rubber may include at least one of low-density polyethylene (LDPE), linear low-density polyethylene (LLDPE), an ethylene-alpha olefin copolymer, a propylene-alpha olefin copolymer, an ethylene-vinyl acetate (EVA) copolymer, an ethylene-methylacrylate (EMA) copolymer, an ethylene-ethylacrylate (EEA) copolymer, a styrene-butadiene-styrene (SBS) rubber, a styrene-ethylene-butadiene-styrene (SEBS) copolymer, an ethylene-propylene-diene monomer (EPDM) rubber, an ethyleneglycol dimethacrylate (EDM) rubber, an ethylene-butylacrylate (EBA) copolymer, and polyolefin elastomer (POE).

In addition, in the flame-retardant plastic material composition according to an embodiment of the present disclosure, an impact strength may be from 6 to 50 kgf·cm/cm.

In addition, in the flame-retardant plastic material according to an embodiment of the present disclosure, a flexural modulus may be from 16000 to 50000 kgf/cm$^2$.

In addition, in the flame-retardant plastic material composition according to an embodiment of the present disclosure, a heat deflection temperature (HDT) under a load of 0.45 kg may be from 95 to 160° C.

In addition, in the flame-retardant plastic material composition according to an embodiment of the present disclosure, a melt index (MI) at 230° C. under a load of 2.16 kg may be from 4 to 40 g/10 min.

In accordance with another aspect of the present disclosure, a method of manufacturing a flame-retardant plastic material composition according to an embodiment of the present disclosure includes: mixing plastic material precursor including 24 to 35 parts by weight (wt %) of polypropylene resin, 30 to 45 parts by weight (wt %) of magnesium hydroxide, 8 to 20 parts by weight (wt %) of melamine-based resin, 8 to 20 parts by weight (wt %) of talc, 5 to 15 parts by weight (wt %) of rubber, 0.5 to 3 parts by weight (wt %) of coupling agent, and other inevitable impurities based on 100 parts by weight (wt %) of the flame-retardant plastic material composition; and extruding the plastic material precursor.

In addition, in the method of manufacturing the flame-retardant plastic material composition according to an embodiment of the present disclosure, the plastic material precursor may further include greater than 0 parts by weight (wt %) and equal to or less than 0.1 parts by weight (wt %) of an antioxidant based on 100 parts by weight (wt %) of the flame-retardant plastic material composition.

In addition, in the method of manufacturing the flame-retardant plastic material composition according to an embodiment of the present disclosure, the extruding may be performed at a temperature of 180 to 230° C.

In accordance with another aspect of the present disclosure, a home appliance includes: a printed circuit board (PCB); and a housing to surround the PCB, wherein the housing includes a flame-retardant plastic material composition, and the flame-retardant plastic material composition includes polypropylene resin, magnesium hydroxide, melamine-based resin, talc, rubber, and coupling agent, wherein content of the magnesium hydroxide is from 30 to 45 parts by weight (wt %) and content of the talc is from 8 to 20 parts by weight (wt %) based on 100 parts by weight (wt %) of flame-retardant plastic material composition.

In addition, in the home appliance according to an embodiment of the present disclosure, the flame-retardant plastic material composition may include 24 to 35 parts by weight (wt %) of the polypropylene resin, 8 to 20 parts by weight (wt %) of the melamine-based resin, 5 to 15 parts by weight (wt %) of the rubber, and 0.5 to 3 parts by weight (wt %) of the coupling agent based on 100 parts by weight (wt %) of the flame-retardant plastic material composition.

In addition, in the home appliance according to an embodiment of the present disclosure, the magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane, and the melamine-based resin may include at least one of melamine cyanurate and melamine phosphate.

In accordance with another aspect of the present disclosure, a refrigerator includes: a printed circuit board (PCB); and a housing to surround the PCB, wherein the housing includes a flame-retardant plastic material composition, and wherein the flame-retardant plastic material composition includes polypropylene resin, magnesium hydroxide, melamine-based resin, talc, rubber, and coupling agent, wherein content of the magnesium hydroxide is from 30 to 45 parts by weight (wt %) and content of the talc is from 8 to 20 parts by weight (wt %) based on 100 parts by weight (wt %) of the flame-retardant plastic material composition.

In addition, the refrigerator according to an embodiment of the present disclosure may include: a refrigerator main body; and a cabinet bottom provided under the refrigerator main body, wherein the cabinet bottom includes a flame-retardant plastic material composition, and the flame-retardant plastic material composition includes polypropylene resin, magnesium hydroxide, melamine-based resin, talc, rubber, and coupling agent, wherein content of the magnesium hydroxide is from 30 to 45 parts by weight (wt %) and content of the talc is from 8 to 20 parts by weight (wt %) based on 100 parts by weight (wt %) of the flame-retardant plastic material composition.

In addition, in the refrigerator according to an embodiment of the present disclosure, the magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane, and the melamine-based resin may include at least one of melamine cyanurate and melamine phosphate.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
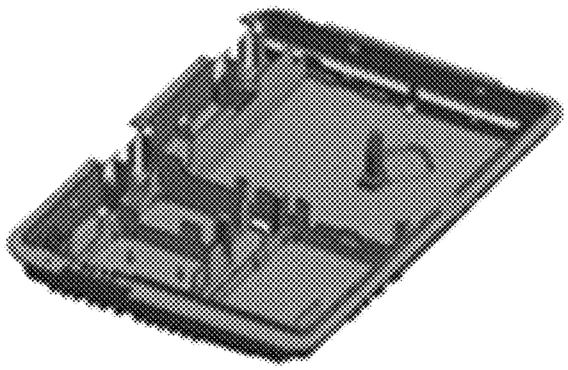
FIG. 1 is a schematic diagram illustrating a case PCB for home appliances manufactured using a flame-retardant plastic material composition according to an embodiment of the present disclosure.

Hereinafter, embodiments of the present disclosure will be described in detail with reference to the accompanying drawings. These embodiments are provided to fully convey the concept of the present disclosure to those of ordinary skill in the art. The present disclosure may, however, be embodied in many different forms and should not be construed as limited to the exemplary embodiments set forth herein. In the drawings, parts unrelated to the descriptions are omitted for clear description of the disclosure and sizes of elements may be exaggerated for clarity.

An object of the present disclosure to solve various problems including the above problems is to provide an eco-friendly flame-retardant plastic material composition having price competitiveness using magnesium hydroxide and a melamine-based flame retardant and a manufacturing method thereof.

Also, an object of the present disclosure is to provide aflame-retardant plastic material composition having improved flame retardancy and mechanical properties by increasing dispersity of magnesium hydroxide and a melamine-based flame retardant in polypropylene, and a manufacturing method thereof.

According to an embodiment of the present disclosure, an eco-friendly flame-retardant plastic material composition having price competitiveness and a manufacturing method thereof may be provided.

Also, according to an embodiment of the present disclosure, a flame-retardant plastic material composition having excellent flame retardancy and mechanical properties with the UL94 5VA grade and a manufacturing method thereof may be provided.

However, the effects obtainable by the flame-retardant plastic material composition and the manufacturing method thereof according to the present disclosure are not limited to the aforementioned effects, and any other effects not mentioned herein will be clearly understood from the following description by those skilled in the art to which the present disclosure pertains.

A flame-retardant plastic material composition and a manufacturing method thereof, according to an embodiment, has improved flame retardancy and mechanical properties by optimizing components of the plastic material composition.

Throughout the specification, the term "include" an element do not preclude the other elements but further includes an element unless otherwise stated.

An expression used in the singular encompasses the expression of the plural unless it has a clearly different meaning in the context.

Hereinafter, reasons for numerical limitations on the contents of components of a flame-retardant plastic material composition according to an embodiment of the present disclosure will be described. Hereinafter, the contents are based on 100 parts by weight of the flame-retardant plastic material composition, unless otherwise stated.

The flame-retardant plastic material composition according to an embodiment of the present disclosure, as a flame-retardant plastic material composition including a polypropylene resin, magnesium hydroxide, a melamine-based resin, talc, a rubber, and a coupling agent, may include 30 to 45 parts by weight of the magnesium hydroxide and 8 to 20 parts by weight of the talc based on 100 parts by weight of the flame-retardant plastic material composition.

In addition, the flame-retardant plastic material composition according to an embodiment of the present disclosure may include 24 to 35 parts by weight of the polypropylene resin, 8 to 20 parts by weight of the melamine-based resin, 5 to 15 parts by weight of the rubber, and 0.5 to 3 parts by weight of the coupling agent based on 100 parts by weight of the flame-retardant plastic material composition.

The content of the magnesium hydroxide may be from 30 to 45 parts by weight.

Magnesium hydroxide is a component playing a role in improving flame retardancy of the flame-retardant plastic material. In consideration thereof, magnesium hydroxide may be added in an amount of 30 parts by weight or more. However, an excess of magnesium hydroxide may deteriorate impact strength and fluidity of the flame-retardant plastic material. In consideration thereof, an upper limit of the content of the magnesium hydroxide may be controlled to 45 parts by weight. Preferably, the content of magnesium hydroxide may be from 35 to 42 parts by weight.

The content of the talc may be from 8 to 20 parts by weight.

Talc may be added to further improve flame retardancy of the flame-retardant plastic material. In consideration thereof, talc may be added in an amount of 8 parts by weight or more. However, an excess of talc may deteriorate impact strength and fluidity of the flame-retardant plastic material. In consideration thereof, an upper limit of the content of the talc may be controlled to 20 parts by weight. Preferably, the content of talc may be from 10 to 15 parts by weight.

The content of the polypropylene resin may be from 24 to 35 parts by weight.

The polypropylene resin is a component playing a role in improving impact strength of the flame-retardant plastic material. In consideration thereof, the polypropylene resin may be added in an amount of 24 parts by weight or more. However, an excess of the polypropylene resin may decrease the contents of the magnesium hydroxide, the melamine-based resin and talc, thereby deteriorating flame retardancy. In consideration thereof, an upper limit of the content of the polypropylene resin may be controlled to 35 parts by weight. Preferably, the content of the polypropylene resin may be from 24 to 33 parts by weight.

The content of the melamine-based resin may be from 8 to 20 parts by weight.

The melamine-based resin, as an auxiliary flame retardant, is a component playing a role in improving flame retardancy of the flame-retardant plastic material like magnesium hydroxide. In consideration thereof, the melamine-based resin may be added in an amount of 8 parts by weight or more. However, an excess of the melamine-based resin may deteriorate impact strength and fluidity of the flame-retardant plastic material. In consideration thereof, an upper limit of the content of the melamine-based resin may be controlled to 20 parts by weight. Preferably, the content of the melamine-based resin may be from 8 to 15 parts by weight.

The content of the rubber may be from 5 to 15 parts by weight.

Rubber is a component capable of improving impact strength of the flame-retardant plastic material. In consideration thereof, rubber may be added in an amount of 5 parts by weight or more. However, an excess of the rubber may deteriorate flame retardancy and flexural modulus of the flame-retardant plastic material. In consideration thereof, an upper limit of the content of the rubber may be controlled to 15 parts by weight. Preferably, the content of the rubber may be from 6 to 10 parts by weight.

The content of the coupling agent may be from 0.5 to 3 parts by weight.

The coupling agent is a component capable of improving impact strength of the flame-retardant plastic material by increasing interfacial adhesion of polypropylene. In consideration thereof, the coupling agent may be added in an amount of 0.5 parts by weight or more. However, an excess of the coupling agent may cause deterioration in price competitiveness. In consideration thereof, an upper limit of the content of the coupling agent may be controlled to 3 parts by weight. Preferably, the content of the coupling agent may be from 1 to 2 parts by weight.

In common manufacturing processes, unintended impurities may be inevitably incorporated from raw materials or surrounding environments, and thus addition of other components is not excluded. These impurities are known to any person skilled in the art of manufacturing and details thereof are not specifically mentioned in the present disclosure.

Also, the flame-retardant plastic material composition according to an embodiment of the present disclosure may further include greater than 0 parts by weight and equal to or less than 0.1 parts by weight of an antioxidant based on 100 parts by weight of the flame-retardant plastic material composition.

The antioxidant plays a role in preventing decomposition of the resins during an injection molding process of the flame-retardant plastic material. In consideration thereof, the antioxidant may be added in an amount greater than 0 parts by weight and equal to or less than 0.1 parts by weight.

The polypropylene resin may include at least one of a propylene homopolymer, an ethylene-propylene random copolymer, and an ethylene-propylene block copolymer.

In addition, the polypropylene resin may have a melt index (MI) of 50 to 100 g/10 min at 230° C. under a load of 2.16 kg based on the ASTM D1238 standards. That is, for easy injection molding, a high-fluidity polypropylene resin may be used.

The magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane.

In addition, the magnesium hydroxide may have an average particle diameter of 0.5 to 5 μm.

The average particle diameter of the magnesium hydroxide is an important factor to control uniform dispersion of flame retardant particles in the polypropylene resin.

A too small average particle diameter of magnesium hydroxide may cause deterioration in dispersity due to aggregation of the flame retardant particles. Thus, a too small average particle diameter of magnesium hydroxide may decrease an interfacial contact area between the polypropylene resin and the flame retardant resulting in deterioration in flame retardancy and mechanical properties. However, a too large average particle diameter of magnesium hydroxide may cause a decrease in the contact area with the polypropylene resin. Therefore, the average particle diameter of magnesium hydroxide may be from 0.5 to 5 μm.

Meanwhile, in the present disclosure, the average means an average of values measured at random five points.

The melamine-based resin may include at least one of melamine cyanurate and melamine phosphate.

The talc may have an average particle diameter of 1 to 20 μm.

A too small average particle diameter of the talc may deteriorate tensile strength of the flame-retardant plastic material. However, a too large average particle diameter of the talc may deteriorate fluidity of the flame-retardant plastic material. Therefore, the average particle diameter of the talc may be from 1 to 20 μm.

The rubber may include at least one of low-density polyethylene (LDPE), linear low-density polyethylene (LLDPE), an ethylene-alpha olefin copolymer, a propylene-alpha olefin copolymer, an ethylene-vinyl acetate (EVA) copolymer, an ethylene-methylacrylate (EMA) copolymer, an ethylene-ethylacrylate (EEA) copolymer, a styrene-butadiene-styrene (SBS) rubber, a styrene-ethylene-butadiene-styrene (SEBS) copolymer, an ethylene-propylene-diene monomer (EPDM) rubber, an ethyleneglycol dimethacrylate (EDM) rubber, an ethylene-butylacrylate (EBA) copolymer, and polyolefin elastomer (POE).

By controlling the components of the flame-retardant plastic material composition as described above, the flame-retardant plastic material composition according to an embodiment of the present disclosure may obtain physical properties as follows.

The flame-retardant plastic material composition according to an embodiment of the present disclosure may have a tensile strength of 130 to 600 kgf/cm$^2$. A too low tensile strength of the flame-retardant plastic material composition may cause deformation or cracks during a process of assembling home appliances. However, a too high tensile strength of the flame-retardant plastic material composition may cause deterioration of fluidity, thereby decreasing productivity. Preferably, the tensile strength of the flame-retardant plastic material composition may be from 150 to 250 kgf/cm$^2$.

The flame-retardant plastic material composition according to an embodiment of the present disclosure may have an impact strength of 6 to 50 kgf·cm/cm. A too low impact strength of the flame-retardant plastic material composition may cause cracks at hook regions used for assembling home appliances. However, a too high impact strength of the flame-retardant plastic material composition may cause deterioration in fluidity, thereby decreasing productivity. Preferably, the impact strength of the flame-retardant plastic material composition may be from 7 to 10 kgf·cm/cm.

The flame-retardant plastic material composition according to an embodiment of the present disclosure may have a flexural modulus of 16000 to 50000 kgf/cm$^2$. A too low flexural modulus of the flame-retardant plastic material composition may cause deformation due to a load of an inner substrate. However, a too high flexural modulus of the flame-retardant plastic material composition may cause cracks at hook regions for assembling home appliances. Preferably, the flexural modulus of the flame-retardant plastic material composition may be from 18000 to 24000 kgf/cm$^2$.

The flame-retardant plastic material composition according to an embodiment of the present disclosure may have a heat deflection temperature (HDT) of 95 to 160° C. under a load of 0.45 kg. A too low heat deflection temperature may cause deformation during an assembling process at a high temperature. However, a too high heat deflection temperature may deteriorate fluidity, thereby decreasing productivity. Preferably, the heat deflection temperature of the flame-retardant plastic material composition may be from 105 to 120° C.

The flame-retardant plastic material composition according to an embodiment of the present disclosure may have a melt index (MI) of 4 to 40 g/10 min at 230° C. under a load of 2.16 kg. A too low the melt index of the flame-retardant plastic material composition makes injection molding difficult. However, a too high melt index of the flame-retardant plastic material composition may cause deterioration in tensile strength and impact strength. Preferably, the melt index of the flame-retardant plastic material composition may be from 5 to 10 g/10 min.

Hereinafter, a method of manufacturing a flame-retardant plastic material composition according to another embodiment of the present disclosure will be described.

The method of manufacturing the flame-retardant plastic material composition according to an embodiment of the present disclosure may include: mixing a plastic material precursor including 25 to 35 parts by weight of a polypropylene resin, 30 to 45 parts by weight of magnesium hydroxide, 8 to 20 parts by weight of a melamine-based resin, 8 to 20 parts by weight of talc, 5 to 15 parts by weight of a rubber, 0.5 to 3 parts by weight of a coupling agent, and other inevitable impurities based on 100 parts by weight of the flame-retardant plastic material composition; and extruding the precursor.

Also, the plastic material precursor may further include greater than 0 parts by weight and equal to or less than 0.1 parts by weight of an antioxidant.

Reasons for numerical limitations on the contents of components of the flame-retardant plastic material composition are as described above, and each process will be described in more detail hereinafter.

Although the process of mixing the plastic material precursor is not particularly limited, the components may be kneaded using a twin-screw extruder by a mechanical shearing method.

The process of extruding may be performed at a temperature of 180 to 230° C.

A too low temperature during the extruding process may delay the manufacturing process, thereby decreasing productivity. However, a too high temperature during the extruding process may increase the possibility of decomposition of magnesium hydroxide. In consideration thereof, the extruding process may be performed at a temperature of 180 to 230° C.

Hereinafter, a home appliance according to another embodiment of the present disclosure will be described.

A home appliance according to an embodiment of the present disclosure includes: a printed circuit board (PCB); and a housing to surround the PCB, wherein the housing includes a flame-retardant plastic material composition, and the flame-retardant plastic material composition includes a polypropylene resin, magnesium hydroxide, a melamine-based resin, talc, a rubber, and a coupling agent, wherein the content of the magnesium hydroxide is from 30 to 45 parts by weight and the content of the talc is from 8 to 20 parts by weight based on 100 parts by weight of the flame-retardant plastic material composition.

In addition, the content of the polypropylene resin may be from 24 to 35 parts by weight, the content of the melamine-based resin may be from 8 to 20 parts by weight, the content of the rubber may be from 5 to 15 parts by weight, and the content of the coupling agent may be from 0.5 to 3 parts by weight based on 100 parts by weight of the flame-retardant plastic material composition.

Reasons for numerical limitations respectively on the contents of components of the flame-retardant plastic material composition are as described above.

The magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane.

The melamine-based resin may include at least one of melamine cyanurate and melamine phosphate.

Meanwhile, types of the home appliance are not particularly limited and any type of home appliances including a printed circuit board (PCB) for home appliances may be included therein.

FIG. 1 is a schematic diagram illustrating a case PCB for home appliances manufactured using a flame-retardant plastic material composition according to an embodiment of the present disclosure.

Referring to FIG. 1, by using a case PCB injection-molded by using the flame-retardant plastic material composition according to the present disclosure, the PCB may be stably fixed and the risk of fire may be effectively cut-off.

Hereinafter, a refrigerator according to another embodiment of the present disclosure will be described.

A refrigerator according to an embodiment of the present disclosure includes: a printed circuit board (PCB) for refrigerators; and a housing surrounding the PCB for refrigerators, wherein the housing includes a flame-retardant plastic material composition, and the flame-retardant plastic material composition includes a polypropylene resin, magnesium hydroxide, a melamine-based resin, talc, a rubber, and a coupling agent, wherein the content of the magnesium hydroxide is from 30 to 45 parts by weight and the content of the talc is from 8 to 20 parts by weight based on 100 parts by weight of the flame-retardant plastic material composition.

Also, the refrigerator according to an embodiment of the present disclosure includes: a refrigerator main body; and a cabinet bottom located under the refrigerator main body, wherein the cabinet bottom includes a flame-retardant plastic material composition, and the flame-retardant plastic material composition includes a polypropylene resin, magnesium hydroxide, a melamine-based resin, talc, a rubber, and a coupling agent, wherein the content of the magnesium hydroxide is from 30 to 45 parts by weight and the content of the talc is from 8 to 20 parts by weight based on 100 parts by weight of the flame-retardant plastic material composition.

The magnesium hydroxide may include at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane, and the melamine-based resin may include at least one of melamine cyanurate and melamine phosphate.

Meanwhile, the flame-retardant plastic material composition may be applied to printed circuit boards (PCBs) of all types of home appliances including washing machines, air conditioners, and washers as well as refrigerators.

The refrigerator main body is identical to common refrigerator main bodies, and a cabinet bottom may be provided under the refrigerator main body.

Figure 2:
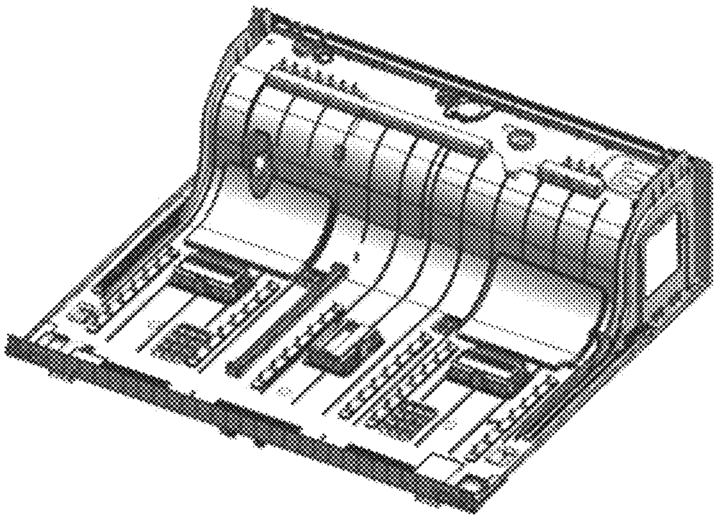
FIG. 2 is a schematic diagram of a refrigerator cabinet bottom manufactured using a flame-retardant plastic material composition according to an embodiment of the present disclosure.

FIG. 2 is a schematic diagram of a refrigerator cabinet bottom manufactured using a flame-retardant plastic material composition according to an embodiment of the present disclosure.

Referring to FIG. 2, by using a cabinet bottom injection-molded manufactured using the flame-retardant plastic material composition according to the present disclosure, an inner space for assembling a machine room may be obtained and the risk of fire may be effectively inhibited. A storage compartment constituting the main body may be located over the cabinet bottom and a machine room may be provided under the cabinet bottom. That is, the cabinet bottom may be provided outside the storage compartment and the machine room. In addition, the cabinet bottom plays a role in separating heat generated in a compressor provided in the machine room from the refrigerator main body located thereover.

Meanwhile, a housing manufactured using the flame-retardant plastic material composition may separate the machine room or compressor from the main body by covering the machine room or compressor in a home appliance including a component emitting heat such as the machine room or compressor as well as refrigerators.

Hereinafter, the present disclosure will be described in more detail with reference to the following examples and comparative examples. However, the following examples are merely presented to exemplify the contents and effects of the present disclosure, and the scope and effects of the present disclosure are not limited thereto.

EXAMPLES

After adding 0.1 parts by weight of an antioxidant to various compositions of a flame-retardant plastic material composition shown in Table 1 below, the mixtures were extruded using a common twin-screw extruder at 200° C. to prepare pellets. Subsequently, the pellets were dried at 75° C. for 2 hours and injection-molded by a small injection molding machine at a molding temperature of 200° C. and a mold temperature of 60° C. to prepare specimens.

TABLE 1

| Example | Components of flame-retardant plastic material composition (parts by weight) | | | | | | |
|---|---|---|---|---|---|---|---|
| | flame-retardant plastic material composition | polypropylene resin | magnesium hydroxide | melamine-based resin | talc | rubber | coupling agent |
| Example 1 | 100 | 29 | 40 | 10 | 9.5 | 10 | 1 |
| Example 2 | 100 | 24 | 40 | 10 | 14.5 | 10 | 1 |
| Example 3 | 100 | 33 | 40 | 10 | 9.5 | 6 | 1 |
| Comparative Example 1 | 100 | 30 | 40 | 10 | 9.5 | 10 | 0 |
| Comparative Example 2 | 100 | 39 | 40 | 10 | 0 | 10 | 1 |
| Comparative Example 3 | 100 | 29 | 50 | 0 | 9.5 | 10 | 1 |
| Comparative Example 4 | 100 | 39 | 32 | 8 | 9.5 | 10 | 1 |

In Table 2 below, test results of testing flame retardancy, tensile strength, impact strength, flexural modulus, heat deflection temperature, and melt index are shown.

With regard to the flame retardancy test, based on the UL94 standards, a specimen having passed a 5VA test was marked as 'O', and a specimen not having passed the 5VA test was marked as 'X'.

The flexural modulus was measured at room temperature at a speed of 5 mm/min based on the ASTM D790 standards.

The heat deflection temperature (HDT) was measured under a load of 0.45 kg based on the ASTM D648 standards.

The melt index (MI) was measured at 230° C. under a load of 2.16 kg based on the ASTM D1238 standards.

TABLE 2

| Example | flame retardancy test | tensile strength (kgf/cm$^2$) | impact strength (kgf · cm/cm) | flexural modulus (kgf/cm$^2$) | heat deflection temperature (° C.) | melt index (g/10 min) |
|---|---|---|---|---|---|---|
| Example 1 | ○ | 150 | 10.0 | 18000 | 105 | 5.5 |
| Example 2 | ○ | 200 | 8.5 | 20000 | 115 | 5.0 |
| Example 3 | ○ | 250 | 7.0 | 24000 | 120 | 6.0 |
| Comparative Example 1 | ○ | 150 | 4.0 | 18000 | 105 | 5.5 |
| Comparative Example 2 | X | 140 | 11.0 | 17000 | 100 | 6.0 |
| Comparative Example 3 | X | 140 | 10.0 | 16000 | 95 | 6.0 |
| Comparative Example 4 | X | 170 | 12.0 | 17000 | 100 | 6.0 |

The 5VA test that is a higher grade test than the 5VB test was performed after specimens passed the 5VB test.

The 5VB test was performed by evaluating whether a time of burning and sparking was equal to or less than 60 seconds after repeating, 5 times, a process of applying a 125 mm flame to a 1.5 mm-thick bar specimen for 5 seconds and removing the flame for 5 seconds. In this regard, a case in which the burning and sparking stopped within 60 seconds was evaluated as passing the 5VB test.

The 5VA test was performed by evaluating whether a hole having a size of 3 mm or more was formed after 30 seconds after repeating, 5 times, a process of applying a 125 mm flame to a 1.5 mm-thick plaque specimen for 5 seconds and removing the flame for 5 seconds. In this regard, a case in which the hole having a size of 3 mm or more was not formed after 30 seconds was evaluated as passing the 5VA test.

The tensile strength was measured at room temperature at a tension speed of 50 mm/min based on the ASTM D638 standards.

The impact strength was measured at room temperature using 6.4 mm-thick specimens based on the ASTM D256 standards.

Referring to Table 2, Examples 1 to 3 satisfied the compositions of components and the manufacturing method provided in the present disclosure. Therefore, Examples 1 to 3 passed the 5VA flame retardancy test. Also, Examples 1 to 3 satisfied all of the tensile strength of 130 to 600 kgf/cm$^2$, the impact strength of 6 to 50 kgf·cm/cm, the flexural modulus of 16000 to 50000 kgf/cm$^2$, the heat deflection temperature of 95 to 160° C., and the melt index of 4 to 40 g/10 min. That is, Examples 1 to 3 had excellent flame retardancy, mechanical properties, and fluidity suitable for injection molding.

However, because the coupling agent was not added to the specimen of Comparative Example 1, dispersity of the flame retardant particles decreased and thus the impact strength could not satisfy the range of 6 to 50 kgf·cm/cm.

Because talc was not added to the specimen of Comparative Example 2, the specimen could not pass the 5VA flame retardancy test. That is, the specimen of Comparative Example 2 had poor flame retardancy.

Because only the magnesium hydroxide was added without adding the melamine-based resin to the specimen of Comparative Example 3, the specimen could not pass the 5VA flame retardancy test. That is, the specimen of Comparative Example 3 had poor flame retardancy.

In Comparative Example 4, while the content of the polypropylene resin was high, the contents of magnesium hydroxide and the melamine-based resin were low. Thus, the specimen of Comparative Example 4 failed to pass the 5VA flame retardancy test. That is, the specimen of Comparative Example 4 had poor flame retardancy.

Figure 3:
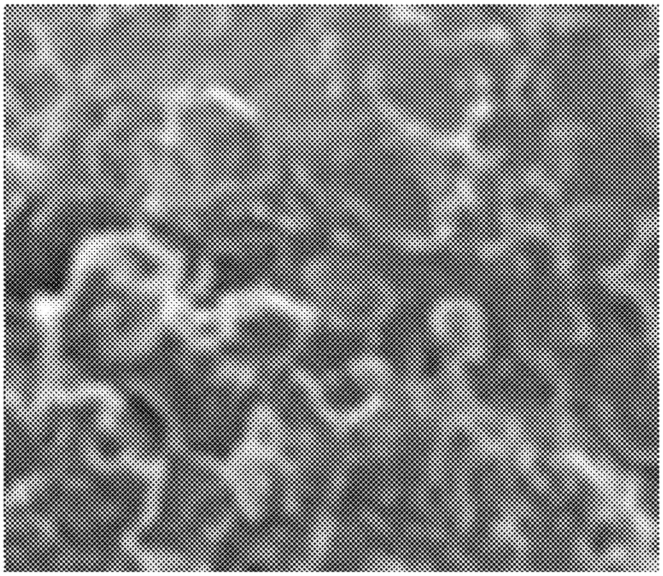
FIG. 3 is a scanning electron microscope (SEM) image of the flame-retardant plastic material composition according to Example 1 of the present disclosure.
Figure 4:
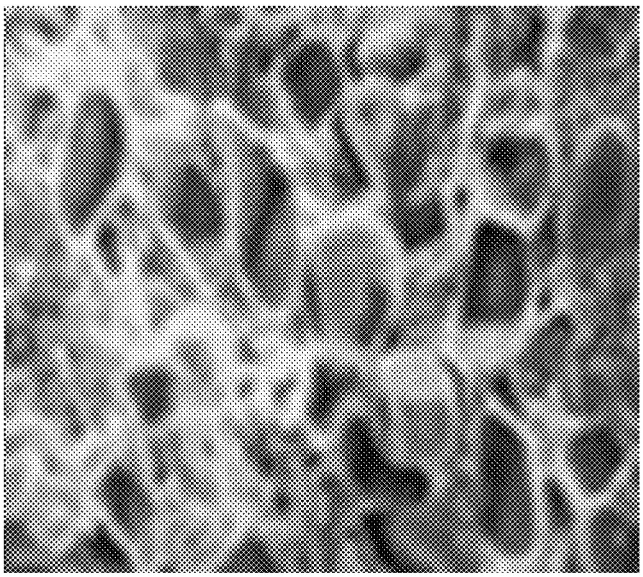
FIG. 4 is an SEM image of the flame-retardant plastic material composition according to Comparative Example 1 of the present disclosure.

FIG. 3 is a scanning electron microscope (SEM) image of the flame-retardant plastic material composition according to Example 1. FIG. 4 is an SEM image of the flame-retardant plastic material composition according to Comparative Example 1.

Referring to FIGS. 3 and 4, it was confirmed that particles were uniformly dispersed in Example 1 due to high dispersity because the coupling agent was used. However, it was confirmed that the particles were not uniformly dispersed in Comparative Example 1 due to low dispersity because the coupling agent was not used.

What is claimed is:

1. A flame-retardant plastic material composition, comprising:

polypropylene resin, magnesium hydroxide, melamine-based resin, talc, rubber, and coupling agent, wherein the flame-retardant plastic material composition includes:

30 to 45 parts by weight (wt %) of the magnesium hydroxide, and 8 to 20 parts by weight (wt %) of the talc based on 100 parts by weight (wt %) of the flame-retardant plastic material composition, wherein a tensile strength of the flame-retardant plastic material composition is from 130 to 600 kgf/cm$^2$, and wherein an impact strength of the flame-retardant plastic material composition is from 6 to 50 kgf·cm/cm.

2. The flame-retardant plastic material composition according to claim 1, further comprising:

24 to 35 parts by weight (wt %) of the polypropylene resin, 8 to 20 parts by weight (wt %) of the melamine-based resin, 5 to 15 parts by weight (wt %) of the rubber, and 0.5 to 3 parts by weight (wt %) of the coupling agent based on 100 parts by weight (wt %) of the flame-retardant plastic material composition.

3. The flame-retardant plastic material composition according to claim 1, further comprising greater than 0 parts by weight (wt %) and equal to or less than 0.1 parts by weight (wt %) of an antioxidant based on 100 parts by weight (wt %) of the flame-retardant plastic material composition.

4. The flame-retardant plastic material composition according to claim 1, wherein the polypropylene resin comprises at least one of propylene homopolymer, ethylene-propylene random copolymer, and ethylene-propylene block copolymer, the magnesium hydroxide comprises at least one of uncoated magnesium hydroxide, magnesium hydroxide coated with vinylsilane, magnesium hydroxide coated with stearic acid, magnesium hydroxide coated with oleic acid, and magnesium hydroxide coated with aminosilane, and the melamine-based resin comprises at least one of melamine cyanurate and melamine phosphate.

5. The flame-retardant plastic material composition according to claim 1, wherein the polypropylene resin has a melt index (MI) of 50 to 100 g/10 min at 230° C. under a load of 2.16 kg.

6. The flame-retardant plastic material composition according to claim 1, wherein the magnesium hydroxide has an average particle diameter of 0.5 to 5 μm, and the talc has an average particle diameter of 1 to 20 μm.

7. The flame-retardant plastic material composition according to claim 1, wherein the rubber comprises at least one of low-density polyethylene (LDPE), linear low-density polyethylene (LLDPE), an ethylene-alpha olefin copolymer, a propylene-alpha olefin copolymer, an ethylene-vinyl acetate (EVA) copolymer, an ethylene-methylacrylate (EMA) copolymer, an ethylene-ethylacrylate (EEA) copolymer, a styrene-butadiene-styrene (SBS) rubber, a styrene-ethylene-butadiene-styrene (SEBS) copolymer, an ethylene-propylene-diene monomer (EPDM) rubber, an ethylene glycol dimethacrylate (EDM) rubber, an ethylene-butylacrylate (EBA) copolymer, and polyolefin elastomer (POE).

8. The flame-retardant plastic material composition according to claim 1, wherein a flexural modulus of the flame-retardant plastic material composition is from 16000 to 50000 kgf/cm$^2$.

9. The flame-retardant plastic material composition according to claim 1, wherein a heat deflection temperature (HDT) of the flame-retardant plastic material composition under a load of 0.45 kg is from 95 to 160° C.

10. The flame-retardant plastic material composition according to claim 1, wherein a melt index (MI) of the flame-retardant plastic material composition at 230° C. under a load of 2.16 kg is from 4 to 40 g/10 min.

11. A method of manufacturing a flame-retardant plastic material composition, the method comprising:

mixing a plastic material precursor comprising:

24 to 35 parts by weight (wt %) of polypropylene resin based on 100 parts by weight (wt %) of the flame-retardant plastic material composition, 30 to 45 parts by weight (wt %) of magnesium hydroxide based on 100 parts by weight (wt %) of the flame-retardant plastic material composition, 8 to 20 parts by weight (wt %) of melamine-based resin based on 100 parts by weight (wt %) of the flame-retardant plastic material composition, 8 to 20 parts by weight (wt %) of talc based on 100 parts by weight (wt %) of the flame-retardant plastic material composition, 5 to 15 parts by weight (wt %) of rubber based on 100 parts by weight (wt %) of the flame-retardant plastic material composition, 0.5 to 3 parts by weight (wt %) of coupling agent based on 100 parts by weight (wt %) of the flame-retardant plastic material composition, and other inevitable impurities based on 100 parts by weight (wt %) of the flame-retardant plastic material composition; and extruding the plastic material precursor, wherein an impact strength of the flame-retardant plastic material composition is from 6 to 50 kgf·cm/cm.

12. The method according to claim 11, wherein the plastic material precursor further comprises greater than 0 parts by weight (wt %) and equal to or less than 0.1 parts by weight (wt %) of an antioxidant based on 100 parts by weight (wt %) of the flame-retardant plastic material composition.

13. The method according to claim 11, wherein the extruding is performed at a temperature of 180 to 230° C.

14. A home appliance comprising:

a printed circuit board (PCB); and a housing to surround the PCB, the housing including a flame-retardant plastic material composition, and wherein the flame-retardant plastic material composition comprises polypropylene resin, magnesium hydroxide, melamine-based resin, talc, rubber, and coupling agent, wherein content of the magnesium hydroxide is from 30 to 45 parts by weight (wt %) and content of the talc is from 8 to 20 parts by weight (wt %) based on 100 parts by weight (wt %) of the flame-retardant plastic material composition, and wherein an impact strength of the flame-retardant plastic material composition is from 6 to 50 kgf·cm/cm.

* * * * *